United States Patent [19]
Pliml, Jr.

[11] Patent Number: 6,071,131
[45] Date of Patent: Jun. 6, 2000

[54] SCREWLESS METAL CIRCUIT BOARD STANDOFF

[75] Inventor: Frank V. Pliml, Jr., Arlington Heights, Ill.

[73] Assignee: Illinois Tool Works Inc., Glenview, Ill.

[21] Appl. No.: 09/061,369

[22] Filed: Apr. 16, 1998

[51] Int. Cl.[7] .................................................. H01R 4/66
[52] U.S. Cl. ........................................................... 439/95
[58] Field of Search ............................... 439/95, 96, 97,
439/92, 567, 571, 572, 573, 574, 575, 569,
555; 361/816; 24/453, 295, 293; 174/138 D,
138 G, 138 R; 411/32, 508, 913, 546, 33

[56] References Cited

U.S. PATENT DOCUMENTS

| | | | |
|---|---|---|---|
| 3,836,703 | 9/1974 | Coules | 174/138 D |
| 4,495,380 | 1/1985 | Ryan et al. | 174/138 D |
| 4,502,193 | 3/1985 | Harmon et al. | 24/621 |
| 4,630,338 | 12/1986 | Osterland et al. | 24/293 |
| 4,781,488 | 11/1988 | Hayashi | 403/408.1 |
| 4,784,550 | 11/1988 | Wollar | 411/32 |
| 5,138,529 | 8/1992 | Colton et al. | 361/424 |
| 5,191,513 | 3/1993 | Sugiura et al. | 361/399 |
| 5,295,862 | 3/1994 | Mosquera | 439/567 |
| 5,707,244 | 1/1998 | Austin | 439/95 |
| 5,759,004 | 6/1998 | Kuffel | 411/508 |
| 5,833,480 | 11/1998 | Austin | 439/95 |

*Primary Examiner*—Paula Bradley
*Assistant Examiner*—Ross Gushi
*Attorney, Agent, or Firm*—Kane, Dalsimer, Sullivan and Levy, LLP

[57] ABSTRACT

The standoff for mounting a circuit board to a chassis includes two parts. The first part is a grounding clip which includes two legs for engaging a chassis and supporting an apertured platform. The second part is a spring arm detent attachment with two elastically opposed spring arms with enlarged detent elements at distal ends thereof. Flanges are provided laterally adjacent to the spring arms. The flanges are spaced from the spring arms by a distance substantially equal to the sum of the thickness of the apertured platform and the circuit board. The spring arms, when manually urged toward each other, pass through the aperture of the circuit board and the aperture of the apertured platform and subsequently extend away from each other to form a detent engagement.

13 Claims, 2 Drawing Sheets

SCREWLESS METAL CIRCUIT BOARD STANDOFF

BACKGROUND OF INVENTION

1. Field of Invention

This invention pertains to a circuit board standoff for mounting a circuit board to a chassis, the circuit board standoff employing a detent mechanism.

2. Description of the Prior Art

In the prior art, it is well known to secure circuit boards in a computer or other electronic equipment in a parallel but offset position from the chassis of the computer. The devices, referred to as "standoffs", used to secure the circuit boards in this position must additionally ground the circuit board.

In the prior art, standoffs have included threaded members, such as screws or threaded rods, directed upward through the chassis and through unthreaded collars or sleeves. The circuit board, in turn, provided with mounting holes, are attached to the threaded members by nuts, and are separated from the chassis by a distance equal to the length of the collars or sleeves. A typical example of a threaded standoff which requires a separate screw for mounting is ITW Fastex® "Grounding PCB Support", formerly Fastex Part No. 8182-13-02.

The use of threaded attachment devices, such as screws, in the standoff increases the work required to install the standoffs and the circuit board.

The assignee of the present invention is the assignee of U.S. Pat. No. 5,707,244 entitled "Standoff Ground Connector" issued on Jan. 13, 1998 to Ronald Austin and U.S. patent application Ser. No. 08/799,110 filed on Feb. 11, 1997 entitled "Standoff Ground Connector" to Ronald Austin.

OBJECTS AND SUMMARY OF THE INVENTION

It is therefore an object of this invention to provide a standoff which performs the essential functions of a standoff and which further is easily installed.

It is therefore a further object of this invention to provide a standoff which eliminates, or at least minimizes, the use of threaded connections.

It is therefore a still further object of this invention to provide a standoff which requires substantially no increased manufacturing expense compared to the prior art.

These and other objects are attained by providing a standoff which includes a first part, a grounding clip, which is secured to an aperture in the chassis or other structural component of the computer or electronic device. This first part or grounding clip includes legs which offset an apertured platform from the chassis. The apertured platform is parallel to the chassis and provides a surface against which the circuit board is mounted. The user aligns an aperture in the circuit board with the aperture in the apertured platform.

A second part includes detent spring arms. The user squeezes the detent spring arms together and then passes the spring arms through the aperture in the circuit board from the top (or at least the side opposite the first part) and likewise passes the spring arms through the aperture of the apertured platform of the first part (or grounding clip). The second part includes flanges immediately above the spring arms which urge against the upper surface of the circuit board. The user then releases the spring arms which then flex outwardly thereby securing the first part of the standoff to the second part of the standoff with the circuit board therebetween.

BRIEF DESCRIPTION OF THE DRAWINGS

Further objects and advantages of the invention will become apparent from the following description and claims, and from the accompanying drawings, wherein:

DETAILED DESCRIPTION OF THE PREFERRED EMBODIMENT

Figure 1:
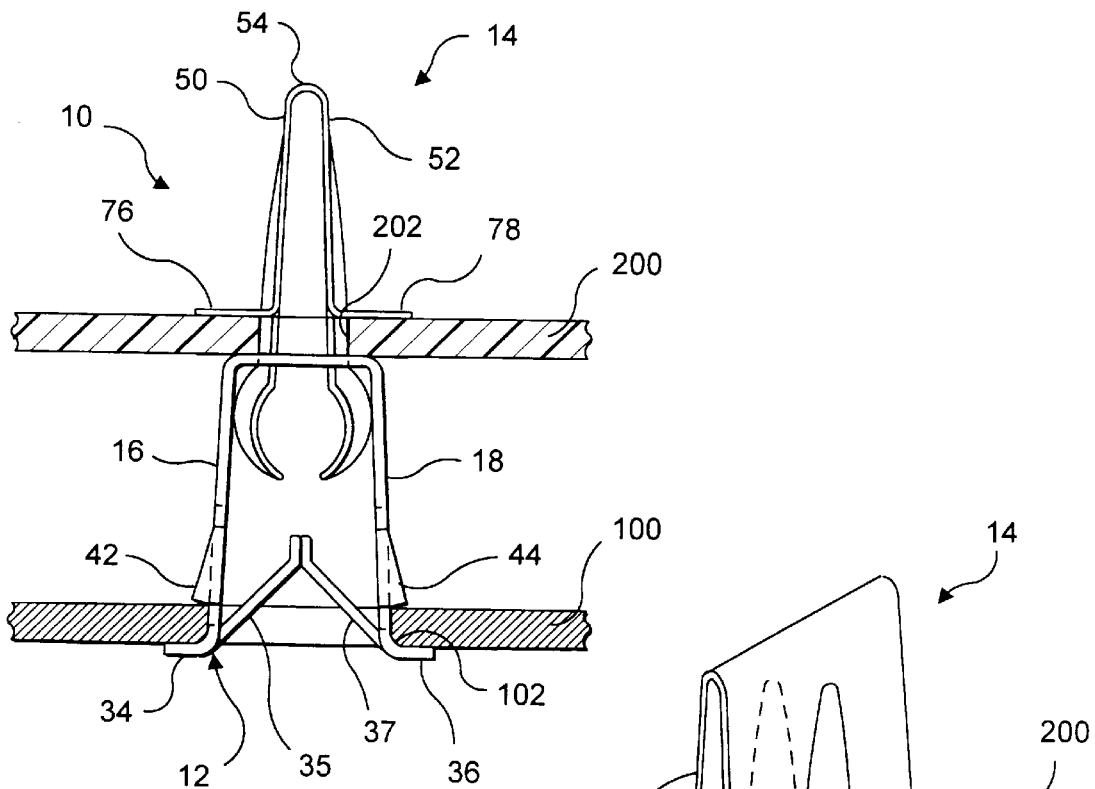
FIG. 1 is a front plan view of the circuit board mounted to the chassis by the standoff of the present invention, which includes a grounding clip and a spring arm detent attachment.
Figure 2:
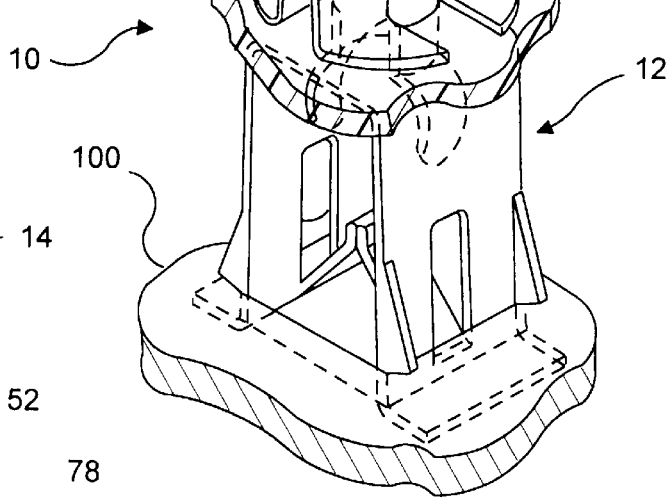
FIG. 2 is a front and top perspective view of the circuit board (shown in phantom) mounted to the chassis by the standoff of the present invention, which includes a grounding clip and a spring arm detent attachment.

Referring now to the drawings in detail wherein like numerals refer to like elements throughout the several views, one sees that FIG. 1 is a side plan view and FIG. 2 is a corresponding top perspective view of the standoff 10 of the present invention in relationship to the chassis 100 (and aperture 102 therein) of the computer or electronic apparatus (not shown) and the circuit board 200 (and aperture 202 therein).

Figure 3:
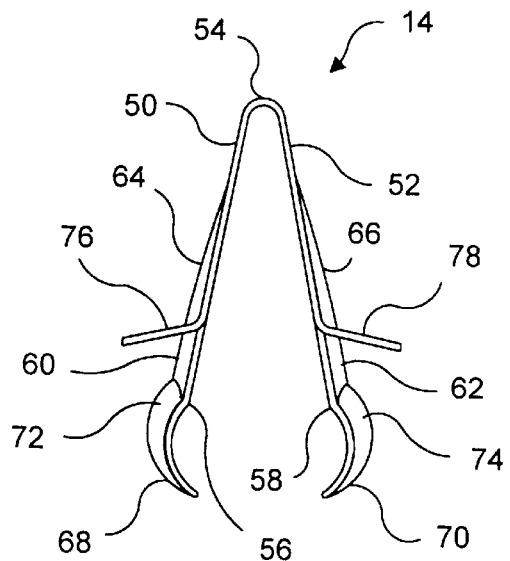
FIG. 3 is a front plan view of the spring arm detent attachment of the present invention.
Figure 4:
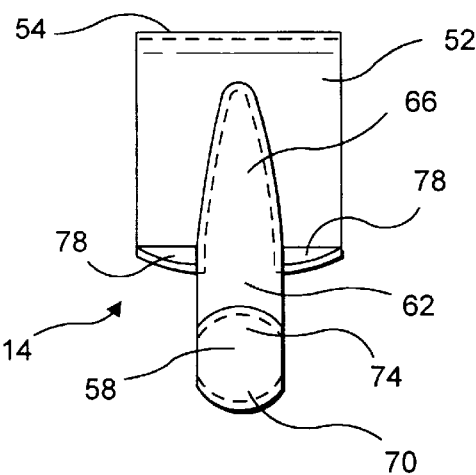
FIG. 4 is a side plan view of the spring arm detent attachment of the present invention.
Figure 5:
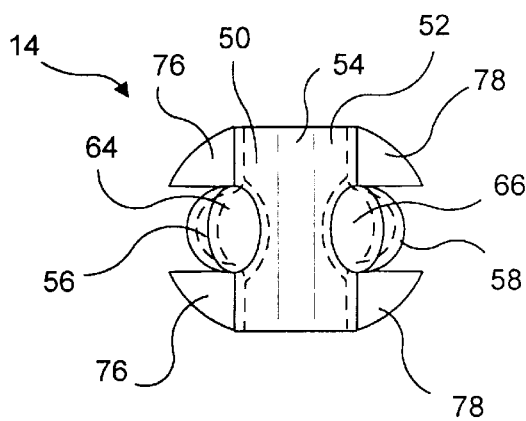
FIG. 5 is a top plan view of the spring arm detent attachment of the present invention.
Figure 6:
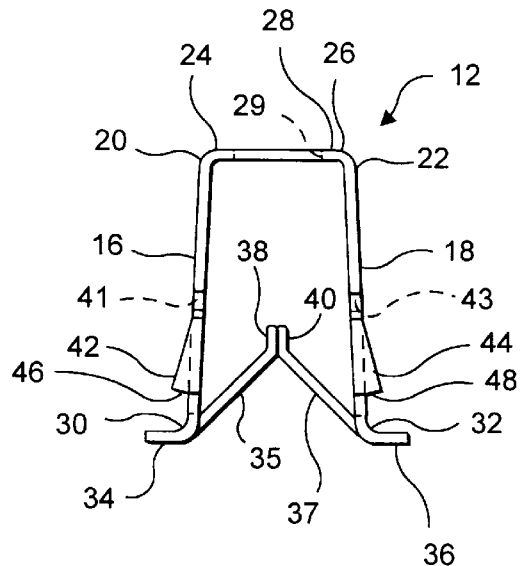
FIG. 6 is a front plan view of the grounding clip of the present invention.
Figure 7:
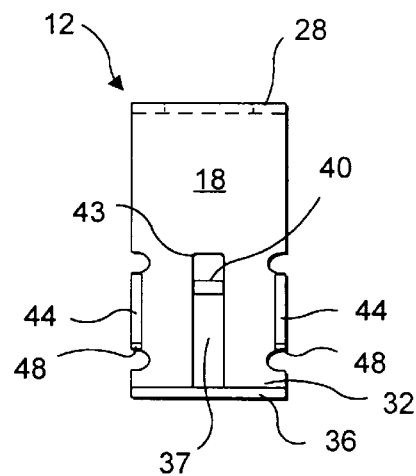
FIG. 7 is a side plan view of the grounding clip of the present invention.
Figure 8:
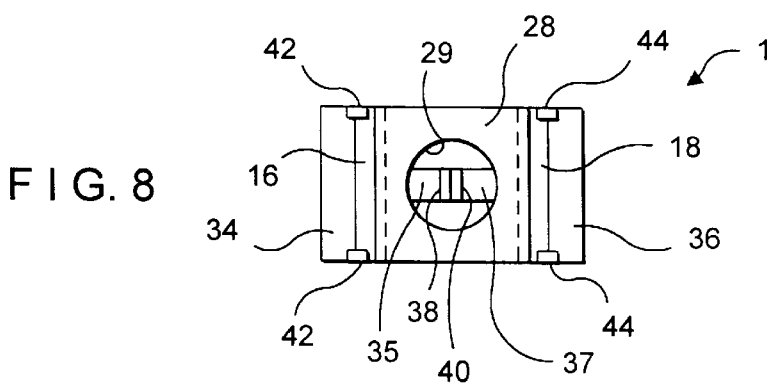
FIG. 8 is a top plan view of the grounding clip of the present invention.

Standoff 10 of the present invention includes grounding clip 12 shown in detail in FIGS. 6–8 and spring arm detent attachment 14 shown in detail in FIGS. 3–5.

Grounding clip 12 includes legs 16, 18. Upper ends 20, 22 of legs 16, 18 are integral with ends 24, 26, respectively, of apertured platform 28. Aperture 29 passes through apertured platform 28. Lower ends 30, 32 of legs 16, 18 include outturned feet 34, 36, respectively, which are substantially parallel with chassis 100 in order to be coplanar therewith and form a reliable electrical ground and mechanical connection therewith. Additionally, legs 16, 18 are designed to splay outwardly somewhat in an uninstalled position, so that legs 16, 18 are manually urged inwardly during installation and elastically retain reliable mechanical and electrical contact against the walls of aperture 102 in chassis 100. In order to add further stiffness to legs 16, 18, supports 35, 37 are provided to legs 16, 18, respectively. As shown in FIGS. 6 and 7, supports 35, 37 are provided from the material of legs 16, 18, respectively, by slitting the legs 16, 18 along the upper end and lateral sides of the rectangular shape of supports 35, 37. Supports 35, 37 are bent inwardly to urge against each other, with the distal ends 38, 40 of supports 35, 37 contacting each other. Apertures 41, 43 are thereby formed in legs 16, 18 by the material displaced to form supports 35, 37, respectively. This allows grounding clip 12 to be formed from a first single piece of sheet metal, typically 0.010 inch thick 1050 steel. Spring arm detent attachment 14 is made from the same or similar material and is likewise preferably formed from a second single piece of sheet metal. Those skilled in the art will realize that other materials and other thicknesses may be suitable for various applications.

Outturned flanges 42, 44 are formed on the lateral edges of legs 16, 18, respectively, by turning out a triangular segment of metal extending from the single piece of sheet metal used to fabricate grounding clip 12. Outturned flanges 42, 44 have lower horizontal (in the illustrated orientation) segments 46, 48, respectively, which are offset from an upper surface of outturned feet 34, 36 by a distance substantially equal to the thickness of chassis 100. When grounding clip 12 is installed in the aperture 102 of chassis 100, chassis 100 is positioned between outturned feet 34, 36 and lower horizontal segments 46, 48 of outturned flanges 42, 44, respectively.

Spring arm detent attachment 14 is likewise formed from a second single piece of sheet metal. Spring arm detent segment 14 includes two opposed substantially rectangular segments 50, 52 joined by a spring-like joint segment 54 of a very small radius of curvature. Spring arms 56, 58 extend downwardly from the central portions of lower surfaces 60, 62 of opposed rectangular segments 50, 52. The elastic characteristics of the sheet metal used to manufacture spring arm detent attachment 14 along with the very small radius of curvature of joint segment 54 give the spring-like or elastic characteristic to joint segment 54. It is essential to the operation of spring arm detent attachment 14 that a user be able to manually squeeze the two opposed rectangular segments 50, 52 together thereby urging spring arms 56, 58 together thereby allowing spring arms 56, 58 to pass through apertures 202 and 29, and then release opposed rectangular segments 50, 52 allowing opposed rectangular segments 50, 52, and hence spring arms 56, 58 to move away from each other to a detent position as shown in FIGS. 1 and 2 and as will be described in more detail hereinbelow.

As shown in FIG. 5, spring arms 56, 58 have a radius of curvature when viewed from above or below. This radius of curvature is intended to substantially match the radius of aperture 202 in circuit board 200 (see FIG. 1) and likewise the radius of aperture 29 of apertured platform 28 of grounding clip 12. As shown in FIGS. 3 and 4, this area of curvature 64, 66 extends upwardly into the central portion of opposed rectangular segments 50, 52, respectively.

Distal ends 68, 70 of spring arms 56, 58 include enlarged detent portions 72, 74, respectively. Outturned flanges 76, 78 are formed laterally adjacent to spring arms 56, 58, respectively, on lower surfaces 60, 62 of opposed rectangular segments 50, 52. Outturned flanges 76, 78 are spaced from enlarged detent portions 72, 74, respectively, by a distance substantially equal to the total thickness of circuit board 200 and apertured platform 28 in order to form the tight engagement shown in FIG. 1.

In order to use standoff 10 of the present invention, the user installs grounding clip 12 to chassis 100. This requires that legs 16, 18 be squeezed together, inserted into aperture 102 and then released so that legs 16, 18 form a secure mechanical and electrical connection with the walls of aperture 102. The user then aligns aperture 202 of circuit board 200 with aperture 29 of apertured platform 28 of grounding clip 12, squeezes opposed rectangular segments 50, 52 of spring arm detent attachment 14 so that spring arms 56, 58 are urged toward each other, inserts spring arms 56, 58 through aligned apertures 202 and 29, and releases opposed rectangular segments 50, 52 so that spring arms 56, 58 travel away from each other and form the detent engagement shown in FIG. 1.

Thus the several aforementioned objects and advantages are most effectively attained. Although a single preferred embodiment of the invention has been disclosed and described in detail herein, it should be understood that this invention is in no sense limited thereby and its scope is to be determined by that of the appended claims.

What is claimed is:

1. A standoff ground connector for mounting a circuit board to a chassis in a piece of electronic equipment in a standoff grounded position relative thereto, said standoff ground connector comprising:

a grounding clip including legs for attaching said standoff ground connector fixedly to the chassis, said legs supporting a platform which further includes an aperture, a detent assembly including two elastically opposed spring arms joined through an elastic joint, said spring arms configured so that free ends thereof may be urged together to pass through an opening in the circuit board and said aperture of said grounding clip, said spring arms thereafter moving apart to form a detent arrangement with said grounding clip wherein each of said spring arms, proximal said free ends, includes an outwardly directed detent element for engagement with said grounding clip legs and a lateral flange spaced apart from said detent element toward said elastic joint.

2. The standoff of claim 1 wherein said legs of said grounding clip include outturned feet for engaging a passageway in said chassis.

3. The standoff of claim 2 wherein sides of said legs of said grounding clip include outturned flanges offset from said outturned feet by a distance substantially equal to a thickness of the chassis, whereby when said grounding clip attaches to the chassis, the chassis is engaged between said outturned flanges and said outturned feet.

4. The standoff of claim 3 wherein said outturned flanges and said outturned feet are integral with said grounding clip.

5. The standoff of claim 4 wherein supports are formed from material of said legs and urged inwardly to contact each other.

6. The standoff of claim 5 wherein said grounding clip is formed from a first single piece of sheet metal.

7. The standoff of claim 1 wherein said detent assembly includes two at least partially planar sections joined by an elastic joint, said spring arms extending from said two at least partially planar sections.

8. The standoff of claim 7 wherein said spring arms extend from a central portion of a lower surface of said two at least partially planar sections and said lateral flanges are formed on said lower surfaces laterally adjacent to said spring arms.

9. The standoff of claim 8 wherein said detent elements are spaced from said flanges by a distance substantially equal to a sum of a thickness of said platform and a thickness of the circuit board.

10. The standoff of claim 9 wherein said two at least partially planar sections and said elastic joint are formed from a second single piece of sheet metal.

11. The standoff of claim 10 wherein said elastic joint is formed by bending said second single piece of sheet metal at a relatively small radius of curvature.

12. The standoff of claim 11 wherein said detent assembly is formed from said second single piece of sheet metal.

13. The standoff of claim 12 wherein said spring arms include a portion between said lateral flanges and said detent element and said portion has a radius of curvature substantially equal to a radius of said aperture.

* * * * *